United States Patent
Lee et al.

(10) Patent No.: US 11,190,186 B2
(45) Date of Patent: Nov. 30, 2021

(54) CLOCK GATING CELL WITH LOW POWER AND INTEGRATED CIRCUIT INCLUDING THE SAME

(71) Applicant: Samsung Electronics Co., Ltd., Suwon-si (KR)

(72) Inventors: Youngo Lee, Suwon-si (KR); Ahreum Kim, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/222,197

(22) Filed: Apr. 5, 2021

(65) Prior Publication Data

US 2021/0320660 A1 Oct. 14, 2021

(30) Foreign Application Priority Data

Apr. 8, 2020 (KR) .................. 10-2020-0042978
Oct. 19, 2020 (KR) .................. 10-2020-0135523

(51) Int. Cl.
*H03K 19/00* (2006.01)
*H03K 3/012* (2006.01)

(52) U.S. Cl.
CPC ......... *H03K 19/0016* (2013.01); *H03K 3/012* (2013.01); *H03K 19/0013* (2013.01)

(58) Field of Classification Search
CPC . H03K 19/0016; H03K 19/0013; H03K 3/012
USPC ....................................................... 326/93
See application file for complete search history.

(56) References Cited

U.S. PATENT DOCUMENTS

| 7,365,575 | B2 | 4/2008 | Kim |
|---|---|---|---|
| 7,902,878 | B2 | 3/2011 | Saint-Laurent et al. |
| 8,975,949 | B2 | 3/2015 | Berzins et al. |
| 9,362,910 | B2 | 6/2016 | Gurumurthy et al. |
| 9,564,897 | B1 | 2/2017 | Berzins et al. |
| 10,056,899 | B1* | 8/2018 | Fernald ............... H03K 5/159 |
| 10,177,765 | B2 | 1/2019 | Hsu et al. |
| 10,298,235 | B2 | 5/2019 | Lim et al. |
| 10,491,217 | B2 | 11/2019 | Hsu et al. |
| 10,566,977 | B2 | 2/2020 | Kim et al. |
| 10,944,401 | B1* | 3/2021 | Kim ................ H03K 19/0013 |
| 2008/0129359 | A1* | 6/2008 | Lee .................... H03K 3/0375 327/210 |
| 2014/0266396 | A1* | 9/2014 | Berzins ............. H03K 17/284 327/399 |
| 2015/0048876 | A1* | 2/2015 | Kim ................. H03K 19/0013 327/394 |
| 2015/0200669 | A1* | 7/2015 | Cai ................. H03K 3/356052 327/211 |
| 2016/0147252 | A1* | 5/2016 | Tzeng ................ H03K 19/20 327/155 |
| 2016/0211846 | A1* | 7/2016 | Rasouli ............ H03K 17/6872 |

(Continued)

*Primary Examiner* — Don P Le
(74) *Attorney, Agent, or Firm* — Harness, Dickey & Pierce, P.L.C.

(57) ABSTRACT

In an integrated circuit including a clock gating cell based on a set-reset (SR) latch, the clock gating cell includes a first 2-input logic gate configured to receive a clock input and a first signal, and generate a second signal, a first inverter configured to receive the second signal, and generate a clock output, and a 4-input logic gate including a 4-input keeping logic gate configured to generate the SR latch by being cross-coupled to the first 2-input logic gate and keep a level of the first signal.

20 Claims, 13 Drawing Sheets

(56) References Cited

U.S. PATENT DOCUMENTS

| | | |
|---|---|---|
| 2017/0302277 A1* | 10/2017 | Ge .......................... H03K 19/21 |
| 2018/0364781 A1* | 12/2018 | Schreiber .............. G06F 1/3296 |
| 2020/0204180 A1* | 6/2020 | Berzins .............. H03K 19/0016 |
| 2021/0064076 A1* | 3/2021 | Shamanna ............. H03K 19/20 |
| 2021/0143820 A1* | 5/2021 | Lee .......................... G06F 1/08 |

* cited by examiner

CLOCK GATING CELL WITH LOW POWER AND INTEGRATED CIRCUIT INCLUDING THE SAME

CROSS-REFERENCE TO RELATED APPLICATIONS

This application is based on and claims priority under 35 U.S.C. § 119 to Korean Patent Applications No. 10-2020-0042978, filed on Apr. 8, 2020, and No. 10-2020-0135523, filed on Oct. 19, 2020, in the Korean Intellectual Property Office, the disclosures of which are incorporated by reference herein in their entirety.

BACKGROUND

The inventive concepts relate to a clock gating cell, and more particularly, to a clock gating cell having low power and an integrated circuit including the clock gating cell.

An integrated circuit configured to process a digital signal may operate in synchronization with a clock signal. For example, an integrated circuit may include a digital circuit configured to generate an output signal by processing an input signal in response to a rising edge and/or a falling edge of a clock signal, and when an edge of the clock signal does not occur, an operation of the digital circuit may stop. Clock gating may refer to stopping or resuming the operation of the digital circuit by selectively providing a clock signal, and by performing the clock gating, power consumption by the digital circuit may be reduced.

The integrated circuit may include a clock gating circuit, that is, a clock gating cell that selectively outputs a clock signal in response to a control signal. The clock gating cell may be required to stop and resume supply of a clock signal to reduce or prevent malfunction of a digital circuit which receives the clock signal, and at the same time, may also be required to have high efficiency, for example, a reduced area and low power consumption.

SUMMARY

Some example embodiments of the inventive concepts provide a clock gating cell configured to perform clock gating with a reduced area and lower power consumption and an integrated circuit including the clock gating cell.

According to some example embodiments of the inventive concepts, in an integrated circuit including a clock gating cell based on a set-reset (SR) latch, the clock gating cell includes a first 2-input logic gate configured to receive a clock input and a first signal, and generate a second signal, a first inverter configured to receive the second signal, and generate a clock output, and a 4-input logic gate including a 4-input keeping logic gate configured to generate the SR latch by being cross-coupled to the first 2-input logic gate and keep a level of the first signal, a second 2-input logic gate configured to receive the clock input and an inverted enable input, and generate the first signal, and a first transistor connected to a ground node, the first transistor configured to receive the second signal, and generate a discharge path shared by the 4-input keeping logic gate and the second 2-input logic gate.

According to some example embodiments of the inventive concepts, a clock gating cell based on the SR latch includes a first NAND gate configured to receive a first signal and a clock input and generate a second signal, a first inverter configured to receive the second signal and generate a clock output; and an OR-AND-INVERTER (OAI) gate configured to provide a second NAND gate, the second NAND gate configured to generate the first signal, and generate the SR latch by being cross-coupled to the first NAND gate, wherein the OAI gate includes an input logic gate configured to generate the first signal based on an inverted enable input and the clock input, an input keeping logic gate configured to keep a level of the first signal based on the first signal, the second signal, the clock input, and an inverted first signal, and a first n-channel Field Effect Transistor (NFET) connected between a first node and a ground node, the first NFET configured to generate a discharge path, and the first node being shared by the input keeping logic gate and the input logic gate.

According to some example embodiments of the inventive concepts, a clock gating cell based on the SR latch includes a first NAND gate configured to receive a first signal and a clock input, and generate a second signal, a first inverter configured to receive the second signal, and generate a clock output, and an OR-AND-INVERTER (OAI) gate configured to provide a second NAND gate, the second NAND gate configured to generate the first signal, and generate the SR latch by being cross-coupled to the first NAND gate, wherein the OAI gate includes an input logic gate configured to generate the first signal based on an inverted enable input and the clock input, and an input keeping logic gate configured to keep a level of the first signal based on the first signal, the second signal, the clock input, and an inverted first signal, wherein the input keeping logic gate includes a second inverter configured to receive the first signal, and generate the inverted first signal by using the second signal.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

In the present specification, logic '1' may correspond to a high voltage, for example, a power voltage VDD or a voltage close to the positive supply voltage, and may be referred to as a high level or an active state, while logic '0' may correspond to a ground potential or a voltage close to the ground potential, and may be referred to as a low level or an inactive state. In addition, in the present specification, the ground node may refer to a node to which the ground potential (or a negative supply voltage) is applied. In the specification, transistors may have an arbitrary structure providing complementary transistors (for example, an n-channel transistor and a p-channel transistor), and as non-limited examples, may be implemented as a Planar Field Effect Transistor (PFET), a Fin Field Effect Transistor (FinFET), a Gate All Around Field Effect (GAAFET), a Vertical Field Effect Transistor (VFET), and the like.

Figure 1A:
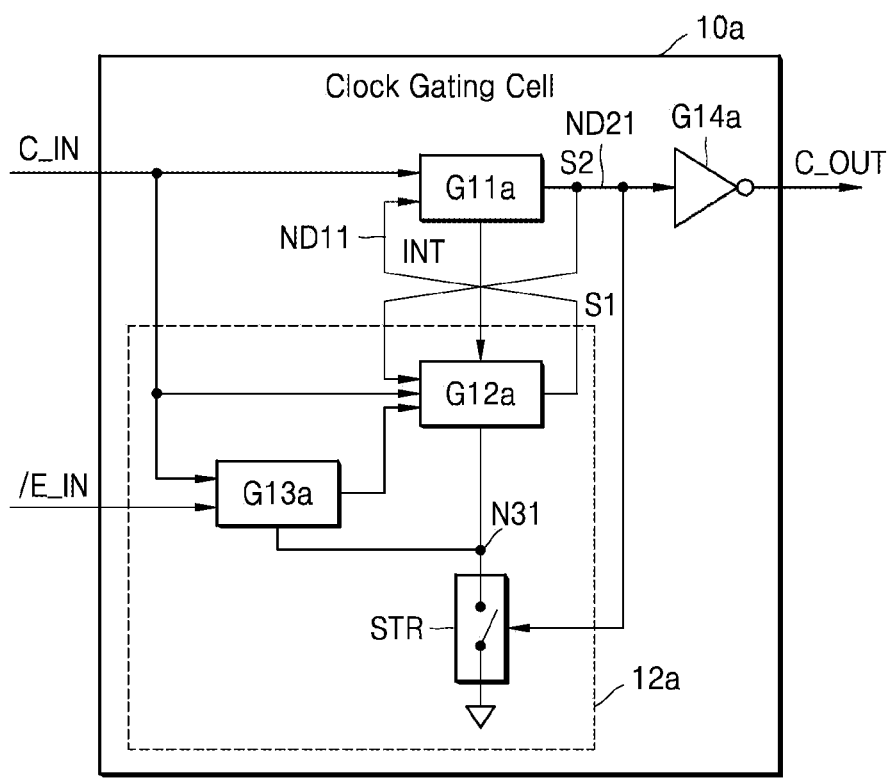
FIGS. 1A and 1B are each a block diagram of an example of a clock gating cell according to an example embodiment of the inventive concepts.
Figure 1B:
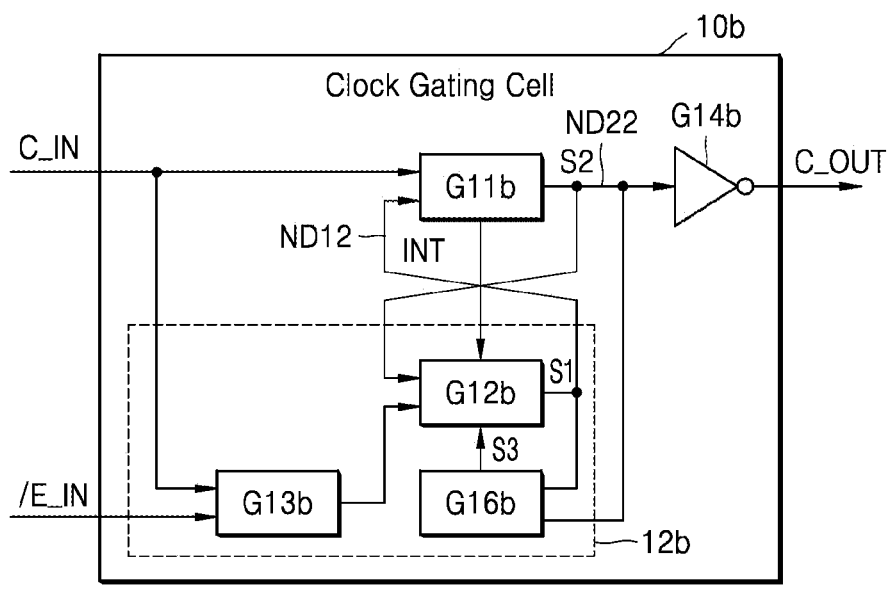

FIGS. 1A and 1B are diagrams of examples of clock gating cells 10a and 10b according to example embodiments of the inventive concepts. In some example embodiments, the clock gating cells 10a and 10b may be included in an integrated circuit manufactured according to a semiconductor process, and may also be referred to as a clock gating circuit or an integrated clock gating cell.

Referring to FIG. 1A, the clock gating cell 10a may receive a clock input C_IN and an inverted enable input /E_IN, and may generate a clock output C_OUT. According to the inverted enable input /E_IN, the clock output C_OUT may vibrate with the clock input C_IN or may be kept at a constant voltage level. For example, the clock gating cell 10a may be in an enable state in response to the inverted enable input /E_IN of a first level, and may generate the clock output C_OUT vibrating according to the clock input C_IN in the enable state. In addition, the clock gating cell 10a may be in a disable state in response to the inverted enable input /E_IN at a second level, and may generate the clock output C_OUT at a constant level (for example, logic '1' or logic '0') in the disable state. In the present specification, it may be defined that the clock gating cell 10a in the enable state supplies the clock output C_OUT and the clock gating cell 10a in the disable state stops supply of the clock output C_OUT.

To reduce or prevent malfunction of a digital circuit receiving the clock output C_OUT, the clock gating cell 10a may stop or resume supply of the clock output C_OUT in synchronization with the clock input C_IN. In some example embodiments, the clock gating cell 10a may stop or resume supply of the clock output C_OUT in response to a rising edge of the clock input C_IN, and may supply the clock output C_OUT to a digital circuit that operates in response to a positive edge of the clock output C_OUT, for example, a positive edge triggered flip-flop. In addition, the clock gating cell 10a may stop or resume providing the clock output C_OUT in response to a falling edge of the clock input C_IN, and may provide the clock output C_OUT to a digital circuit that operates in response to a falling edge of the clock output C_OUT, for example, a negative edge triggered flip-flop. The clock gating cell 10a may include a set-reset (SR) latch structure, and may latch the inverted enable input /E_IN according to the clock input C_IN. As shown in FIG. 1A, the clock gating cell 10a may include a first 2-input logic gate G11a, a 4-input logic gate 12a, and/or an inverter G14a.

The first 2-input logic gate G11a may receive the clock input C_IN and a first signal S1, and may generate a second signal S2 by performing a logical operation on the clock input C_IN and the first signal S1. The first 2-input logic gate G11a may form (or generate) the SR latch by being cross-coupled with a 4-input keeping logic gate G12a, which is provided by the 4-input logic gate 12a, through a first node ND11 and a second node ND21. The first node ND11 may be defined as a node by which the first signal S1 is generated or output, and the second node ND21 may be defined as a node by which the second signal S2 is generated or output. In some example embodiments, the first 2-input logic gate G11a and/or the 4-input keeping logic gate G12a may be implemented as NAND gates and/or NOR gates. The second signal S2 generated by the first 2-input logic gate G11a may be provided to the inverter G14a, and the inverter G14a may generate the clock output C_OUT by inverting the second signal S2.

The 4-input logic gate 12a may receive the inverted enable input /E_IN, the clock input C_IN, the second signal S2, and/or an internal signal INT, and may generate the first signal S1 by performing a logical operation according to the inverted enable input /E_IN, the clock input C_IN, the second input S2, and/or the internal signal INT. The internal signal INT may be a signal generated by an internal node of the first 2-input logic gate G11a. For example, the internal signal INT may be a signal generated by inverting the first signal S1 by the first 2-input logic gate G11a. The 4-input keeping logic gate G12a may form (or generate) or block a charge path or a discharge path to keep a level of the first signal S1.

Although FIG. 1A shows that the 4-input logic gate 12a includes the 4-input keeping logic gate G12a and a second 2-input logic gate G13a, an equivalent circuit of the 4-input logic gate 12a, and the 4-input logic gate 12a may provide the same functions as the 4-input keeping logic gate G12a and the second 2-input logic gate G13a which are connected to each other as shown in FIG. 1A and receive input signals. For example, in the 4-input logic gate 12a, the 4-input keeping logic gate G12a and the second 2-input logic gate G13a may share at least one component, for example, at least one transistor, and may be not separated from each other. In addition, according to some example embodiments, the logic gates may receive different numbers of inputs, and accordingly, may be differently referred.

In some example embodiments, the 4-input keeping logic gate G12a may be a NAND gate, the second 2-input logic gate G13a may be an OR gate, and accordingly, the 4-input logic gate 12a may be an OR-AND-INVERTER (OAI) gate. In addition, in some example embodiments, the 4-input keeping logic gate G12a may be a NOR gate, the second 2-input logic gate G13a may be an AND gate, and accordingly, the 4-input logic gate 12a may be an OAI gate.

As shown in FIG. 1A, a circuit that vibrates according to vibration of the clock input C_IN in the disable state (for example, an inverter configured to generate an inverted clock input) may be omitted from the clock gating cell 10a, and accordingly, the clock gating cell 10a may have reduced power consumption in the disable state. Through a configuration of the clock gating cell 10a according to the inventive concepts, the number of transistors receiving the clock input C_IN may be reduced, and due to a reduced input capacitance of the clock input C_IN, not only power consumption by the clock input C_IN but also delay of the clock input C_IN may be reduced.

The 4-input logic gate 12a according to an example embodiment may include a shared transistor STR. The shared transistor STR may be connected to a third node ND31 to which the 4-input keeping logic gate G12a and the second 2-input logic gate G13a are connected. The shared transistor STR may receive the second signal S2 from the first 2-input logic gate G11a, and may be controlled by the second signal S2. The shared transistor STR may form (or generate) or block a discharge path between the third node ND31 and the ground node, which is shared by the 4-input keeping logic gate G12a and the second 2-input logic gate G13a, in response to the second signal S2. For example, the shared transistor STR may form (or generate) or block the discharge path by activating or deactivating pull-down of the 4-input keeping logic gate G12a and the second 2-input logic gate G13a. Accordingly, in the clock gating cell 10a, as the discharge path is formed through one sharing transistor STR, power consumption may be reduced, and dynamic power consumption may be reduced by reducing the number of transistors. Detailed example embodiments of FIG. 1A will be described in detail with reference to FIGS. 2 through 5.

Referring to FIG. 1B, the clock gating cell 10b may include a first 2-input logic gate G11b, a 3-input logic gate 12b, and an inverter G14b. Hereinafter, descriptions that are the same as those of the clock gating cell 10a in FIG. 1A are omitted. The 3-input logic gate 12b may include a 3-input keeping logic gate G12b, a second 2-input logic gate G13b, and/or a third 2-input logic gate G16b. The 3-input logic gate 12b may receive the inverted enable input /E_IN, the clock input C_IN, and/or the second signal, and may generate the first signal S1 by performing a logical operation according to the inverted enable input /E_IN, the clock input C_IN, and/or the second signal S2. The 3-input keeping logic gate G12b may form (or generate) or block a charge path or a discharge path to keep the level of the first signal S1. The third 2-input logic gate G16b may receive the first signal S1 and/or the second signal S2 and generate a third signal S3, and may provide the third signal S3 to the 3-input keeping logic gate G12b. As an example embodiment, the third 2-input logic gate G16b may generate the third signal S3, which is inverted from the first signal S1, by using the second signal S2. The clock gating cell 10b according to the inventive concepts may reduce power consumption by inverting the first signal S1 by using the second signal S2 instead of a power voltage.

Although FIG. 1B shows that the 3-input logic gate 12b includes the 3-input keeping logic gate G12b, the second 2-input logic G13b, and/or the third 2-input logic gate G16b, FIG. 1B shows an equivalent circuit of the 3-input logic gate 12b, and/or the 3-input logic gate 12b may provide the same functions as the 3-input keeping logic gate G12b, the second 2-input logic gate G13b, and/or the third 2-input logic gate G16b that are connected to one another as shown in FIG. 1B and receive the input signals. For example, in the 3-input logic gate 12b, the 3-input keeping logic gate G12b, the second two-input logic gate G13b, and/or the third 2-input logic gate G16b may share at least one component, for example, at least one transistor, and may be not separated from one another.

As shown in FIG. 1B, a circuit that vibrates according to vibration of the clock input C_IN in the disable state (for example, an inverter configured to generate an inverted clock input) may be omitted from the clock gating cell 10b, and accordingly, the clock gating cell 10b may have reduced power consumption in the disable state. Through a configuration of the clock gating cell 10b according to the inventive concepts, the number of transistors receiving the clock input C_IN may be reduced, and due to a reduced input capacitance of the clock input C_IN, not only power consumption by the clock input C_IN but also delay of the clock input C_IN may be reduced.

In some example embodiments, characteristics of the configurations of the clock gating cell 10a in FIG. 1A and the clock gating cell 10b in FIG. 1B may be implemented to be merged with each other. As an example embodiment, a clock gating cell may include the shared transistor STR shown in FIG. 1A and the third 2-input logic gate G16b shown in FIG. 1B.

Figure 2:
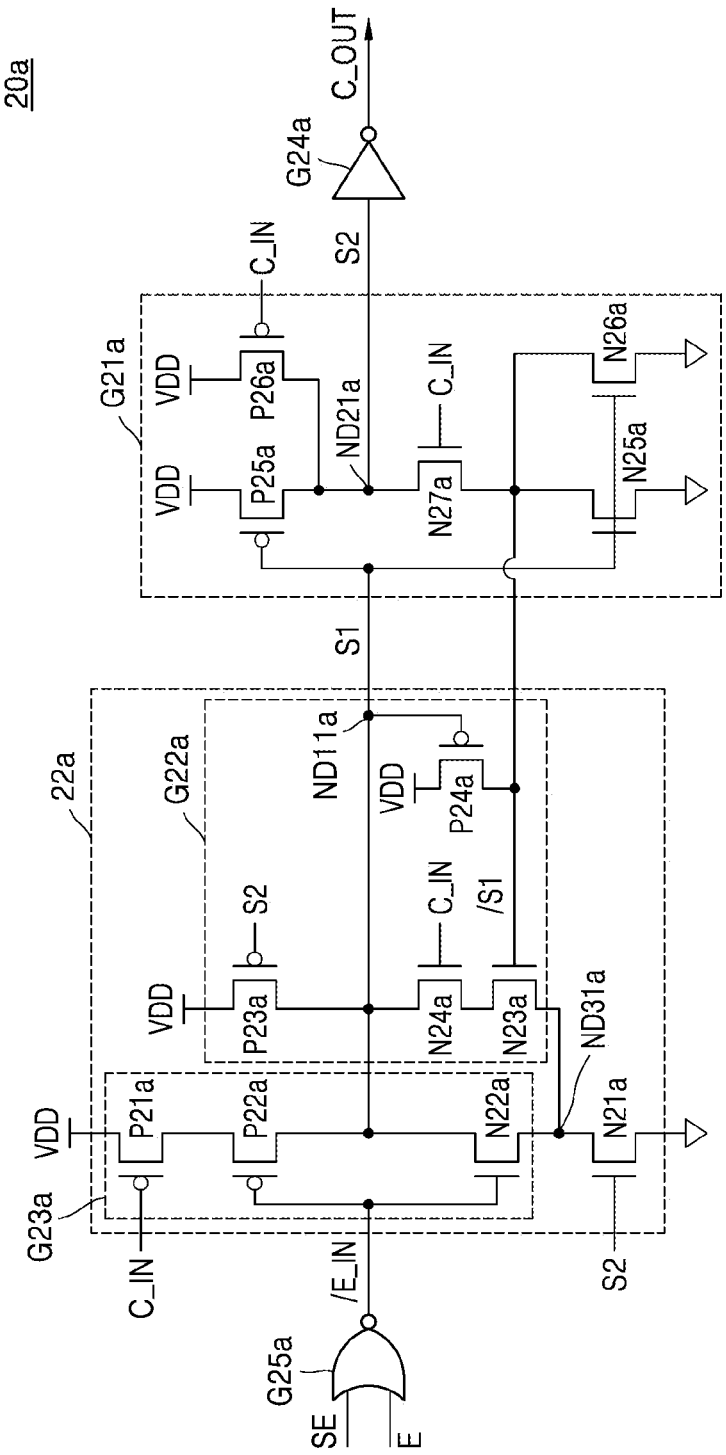
FIG. 2 is a circuit diagram of examples of the clock gating cell shown in FIG. 1A.

FIG. 2 is a circuit diagram of examples of the clock gating cell 10a shown in FIG. 1A. Hereinafter, among descriptions of FIG. 2, descriptions that are the same as those of FIG. 1A are omitted.

Referring to FIG. 2, a clock gating cell 20a may include a first NAND gate G21a, an OAI gate 22a, an inverter G24a, and/or a NOR gate G25a. The first NAND gate G21a may correspond to the first 2-input logic gate G11a shown in FIG. 1A, and the OAI gate 22a may correspond to the 4-input logic gate 12a shown in FIG. 1A. The OAI gate 22a may include a 4-input keeping logic gate G22a and/or a second two-input logic gate G23a.

The OAI gate 22a may include a first n-channel Field Effect Transistor (NFET) N21a through a fourth NFET N24a and/or a first p-channel Field Effect Transistor (PFET) P21a through a fourth PFET P24a, which receive the inverted enable input /E_IN, the clock input C_IN, the second signal S2, and/or an inverted first signal /S1. The first NFET N21a shown in FIG. 2 may correspond to the shared transistor STR shown in FIG. 1A. The first NAND gate G21a may include a fifth NFT N25a through a seventh NFET N27a, a fifth PFET P25a, and/or a sixth PFET P26a, which receive the first signal S1 and the clock input C_IN.

The NOR gate G25a may receive a clock enable E and/or a test enable SE, and may generate the inverted enable input /E_IN and provide the inverted enable input /E_IN to the OAI gate 22a. In some example embodiments, unlike in FIG. 2, the clock gating cell 20a may directly receive the inverted enable input /E_IN from outside as the NOR gate G25a is omitted. Furthermore, in some example embodiments, unlike in FIG. 2, the clock gating cell 20a may include an inverter, which generates the inverted enable input /E_IN from the enable input, instead of the NOR gate G25a.

The 4-input keeping logic gate G22a, which includes a second NAND gate, may perform an operation of the NAND gate, and may form (or generate) an SR latch (or an SR NAND latch) by providing the second NAND gate to the first NAND gate G21a. For example, the first NAND gate G21a and the 4-input keeping logic gate G22a may be cross-coupled through a first node ND11a and a second node ND21a. The first NAND gate G21a, when the first signal S1 is logic '1', may generate the second signal S2 dependent on the clock input C_IN, and when the first signal S1 is logic '0', may generate the second signal S2 that is logic '1', regardless of the clock input C_IN. The OAI gate 22a may generate the first signal S1 by performing an operation on the inverted enable input /E_IN, the clock input C_IN, the second signal S2, and/or the inverted first signal /S1. The first NAND gate G21a may generate the second signal S2 by performing a NAND operation on the first signal S1 and/or the clock input C_IN. The inverter G24a may generate the clock output C_OUT by inverting the second signal S2.

To describe a connection structure of the second 2-input logic gate G23a in detail, the first PFET P21a may receive the clock input C_IN through a gate thereof and/or may be connected to the power voltage VDD through a source thereof. The second PFET P22a may be connected to a drain of the first PFET P21a through a source thereof, and/or may receive the inverted enable input /E_IN through a gate thereof. The second NFET N22a may receive the inverted enable input /E_IN through a gate thereof, and/or may be connected to a drain of the second PFET P22a at the first node ND11a through a drain thereof.

To describe a connection structure of the 4-input keeping logic gate G22a in detail, the third PFET P23a may be connected to the second node ND21a through a gate thereof and receive the second signal S2, and/or may be connected to the power voltage VDD through a source thereof. The third NFET N23a may receive the inverted first signal /S1 through a gate thereof, and/or may be connected to a source of the fourth NFET N24a through a drain thereof. The fourth NFET N24a may receive the clock input C_IN through a gate thereof, and/or may be connected to a drain of the third PFET P23a at the first node ND11a through a drain thereof. The fourth PFET P24a may be connected to the first node ND11a through a gate thereof and/or receive the first signal S1, may be connected to the power voltage VDD through a source thereof, and/or may be connected to the gate of the third NFET N23a through a drain thereof. The first NFET N21a may be connected, through a drain thereof, to a third node ND31a to which a pull-down logic of the second 2-input logic gate G23a (for example, the second NFET N22a) and/or a pull-down logic of the 4-input keeping logic gate G22a (for example, the third NFET N23a) are connected in common, may be connected to the second node ND21a through a gate thereof and receive the second signal S2, and/or may be connected to the ground node through a source thereof. The first NFET N21a, in response to the second signal S2, may form (or generate) or block a discharge path between the third node ND31a and the ground node, which is shared by the second 2-input logic gate G23a and the 4-input keeping logic gate G22a. The third PFET P23a, in response to the second signal S2, may keep a high level of the first signal S1 by using the power voltage VDD, and/or the fourth PFET P24a, in response to the first signal S1, may keep a high level of the inverted first signal /S1 by using the power voltage VDD. In addition, when the first NFET N21a is activated (for example, when the second signal S2 is logic '1'), the third NFET N23a and/or the fourth NFET N24a may keep the low level of the first signal S1, respectively in response to the inverted first signal /S1 and/or the clock input C_IN.

To describe a connection structure of the first NAND gate G21a in detail, the first PFET P25a may receive the first signal S1 through a gate thereof, and/or may be connected to the power voltage VDD through a source thereof. A sixth PFET P26a may receive the clock input C_IN through a gate thereof, may be connected to the power voltage VDD through the source thereof, and/or may be connected to a drain of the fifth PFET P25a at a second node ND21a through a drain thereof. The fifth PFET P25a and the sixth PFET P26a may be connected in parallel to each other and construct a pull-up logic of the first NAND gate G21a. The fifth NFET N25a may receive the first signal S1 through a gate thereof, and/or may be connected to a ground node through a source thereof. The sixth NFET N26a may receive the first signal S1 through a gate thereof, and/or may be connected to the ground node through a source thereof. The fifth NFET N25a and the sixth NFET N26a may be connected in parallel to each other, and may construct a pull-down logic of the first NAND gate G21a. The number of transistors (e.g., the fifth PFET P25a and the sixth PFET P26a) constructing the pull-up logic of the first NAND gate G21a is identical (or equal to) to the number of transistors (e.g., the fifth NFET N25a and the sixth NFET N26a) constructing the pull-down logic, and thus, a pull-up strength and a pull-down strength may be equal to each other. The seventh NFET N27a may receive the clock input C_IN through a gate thereof, may be connected to the second node ND21a through a drain thereof, and/or may be connected to the drains of the fifth NFET N25a and the sixth NFET N26a through a source thereof.

Figure 3:
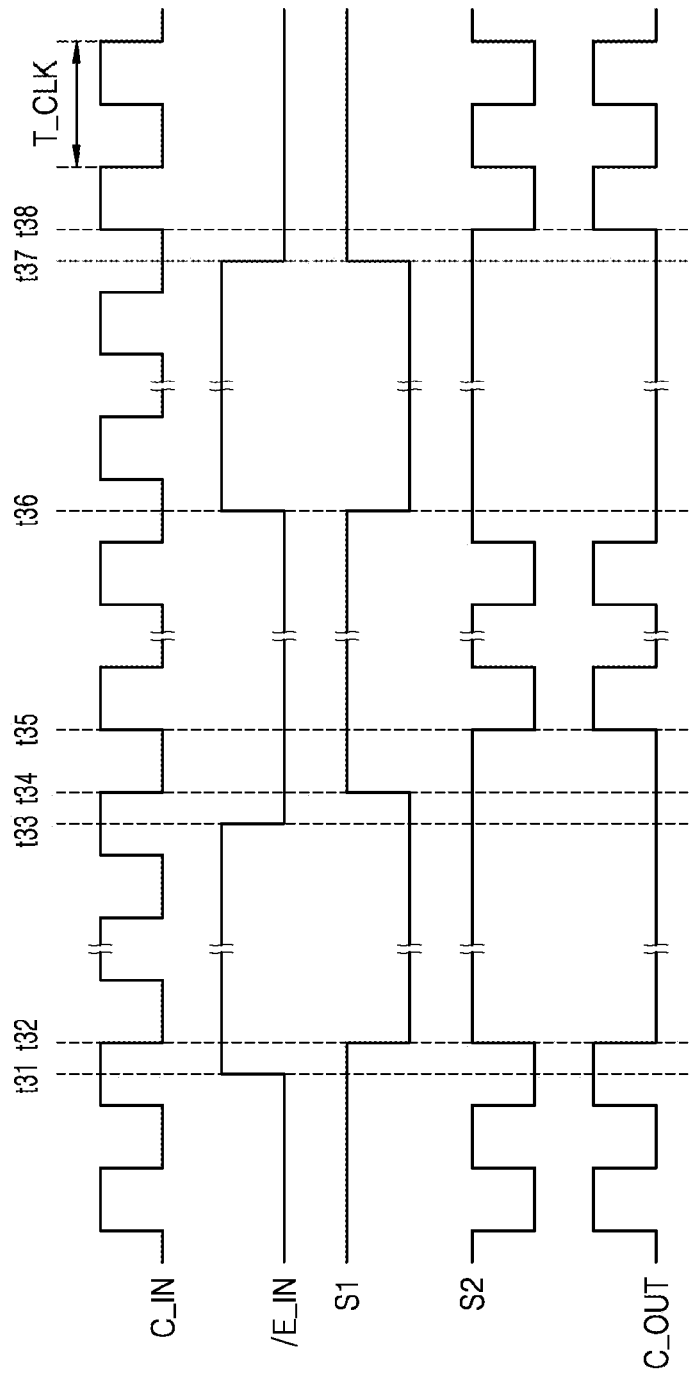
FIG. 3 is a timing diagram of an example of an operation of the clock gating cell shown in FIG. 2.

FIG. 3 is a timing diagram of an example of an operation of the clock gating cell 20a shown in FIG. 2. The timing diagram shown in FIG. 3 shows signals according to time in the clock gating cell 20a shown in FIG. 2. For convenience of understanding, in the timing diagram shown in FIG. 3, propagation delay may be ignored, and among descriptions of FIG. 3, descriptions that are the same as those of FIGS. 1A, 1B, and 2 are omitted.

Referring to FIG. 3, the clock input C_IN may vibrate in a cycle T_CLK. Before a time point t31, the clock enable E and/or the test enable SE may be logic '1', and accordingly, the inverted enable input /E_IN may be logic '0', and the clock gating cell 20a may be in an enable state. Due to the 4-input keeping logic gate G22a, the first signal S1 may be logic '1', the second signal S2 may be identical (or equal to) to an inverted version of the clock input C_IN, and consequentially, the clock output C_OUT may be identical (or equal to) to the clock input (e.g., a delayed version of the clock input C_IN).

At the time point t31, the clock enable E and the test enable SE may be shifted to logic '0', and accordingly, the inverted enable input E_IN may be shifted to logic '1', and the clock gating cell 20a may enter a disable state. As the clock input C_IN is logic '1', the first signal S1 may be kept as logic '1', and the second signal S2 and the clock signal C_OUT may be kept as logic '0' and logic '1', respectively. Next, at a time point t32, a falling edge of the clock input C_IN may occur, and accordingly, by the first NAND gate G21a, the second signal S2 and the clock output C_OUT may be respectively shifted to logic '1' and logic '0'. In addition, by the second two-input logic gate G22a, the first signal S1 may be shifted to logic '1', and accordingly, by the first NAND gate G21a, the second signal S2 may be kept as logic '1' regardless of the clock input C_IN. Consequentially, the clock output C_OUT may be kept as logic '0' in the disable state of the clock gating cell 20a.

At a time point t33, the clock enable E and/or the test enable SE may be shifted to logic '1', and accordingly, the inverted enable input /E_IN may be shifted to logic '0' and the clock gating cell 20a may enter the enable state. As the clock input C_IN and the second signal S2 are logic '1', the first signal S1 may be kept at logic '0', and accordingly, the second signal S2 and the clock output C_OUT may also be kept at logic '1' and logic '0', respectively. Next, at a time point t34, a falling edge of the clock input C_IN may occur, and accordingly, by the second two-input logic gate G22a, the first signal S1 may be shifted to logic '1'. However, as the clock input C_IN is logic '0', the second signal S2 and the clock output C_OUT may respectively maintain logic '1' and logic '0'. Next, at a time point t35, a rising edge of the clock signal C_IN may occur at a time point t35, and as the first signal S1 is logic '1', the second signal S2 and the clock output C_OUT may be respectively shifted to logic '0' and logic '1'.

At a time point t36, the clock enable E and the test enable SE may be shifted to logic '0', and accordingly, the inverted enable input /E_IN may be shifted to logic '1' and the clock gating cell 20a may enter the disable state. As the second signal S2 is logic '1', by the second 2-input logic gate G23a, the first signal S1 may be shifted to logic '0', and accordingly, the second signal S2 and the clock output C_OUT may be respectively kept at logic '1' and logic '0', regardless of the clock input C_IN.

At a time point t37, the clock enable E and/or the test enable SE may be shifted to logic '1', and accordingly, the inverted enable input /E_IN may be shifted to logic '0' and the clock gating cell 20a may enter the enable state.

Although the first signal S1 may be shifted to logic '1' by the OAI gate 22a, as the clock input C_IN is logic '0', the second signal S2 and the clock output C_OUT may be respectively kept at logic '1' and logic '0'. Next, at a time point t38, a rising edge of the clock input C_IN may occur, and the second signal S2 and the clock output C_OUT may be respectively shifted to logic '0' and logic '1'.

As described above, power consumption in a section keeping a low level of the first signal S1 may be efficiently reduced by using a discharge path formed through the first NFET N21a in FIG. 2, and the quality of the second signal S2 may be improved through the first NAND gate G21a (see FIG. 2) implemented to have the pull-up strength and the pull-down strength that are equal to each other.

Figure 4:
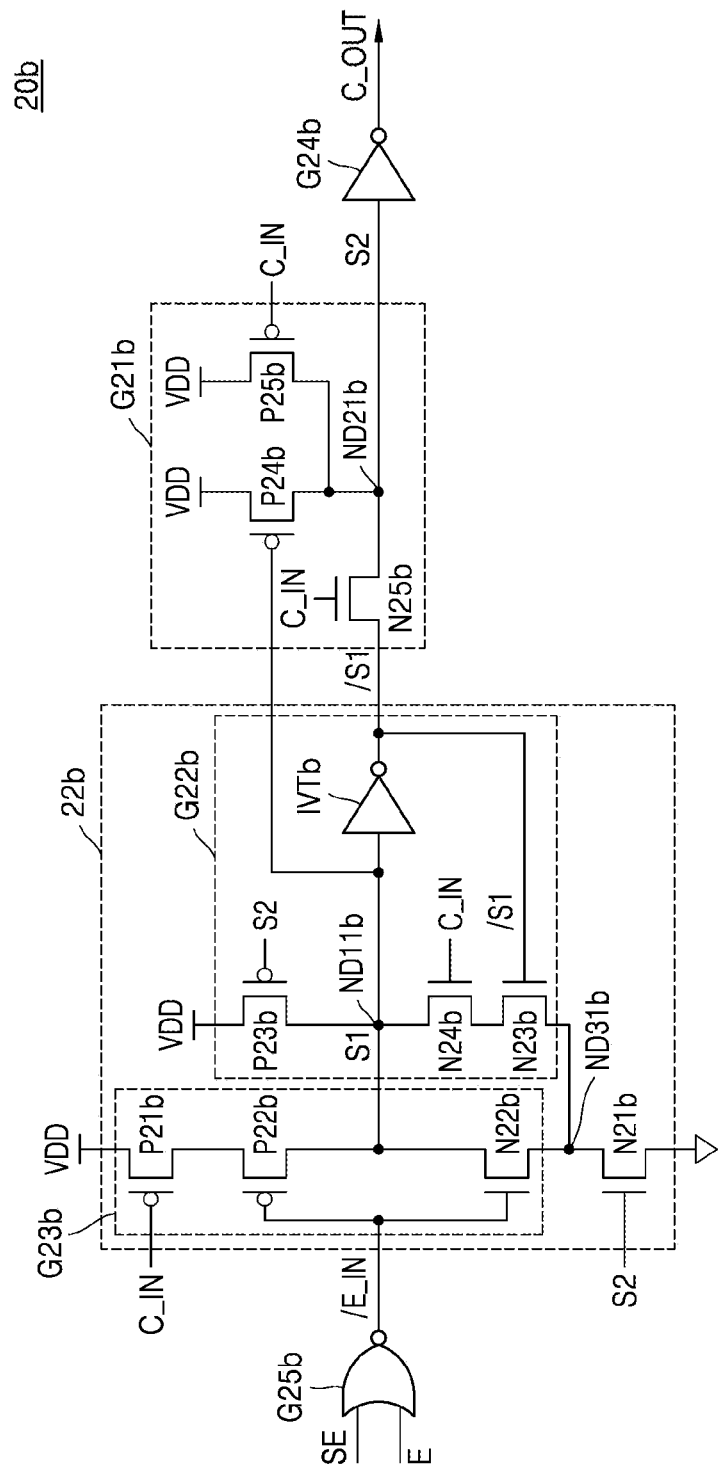
FIGS. 4 and 5 are circuit diagrams of examples of a clock gating cell according to an example embodiment of the inventive concepts.
Figure 5:
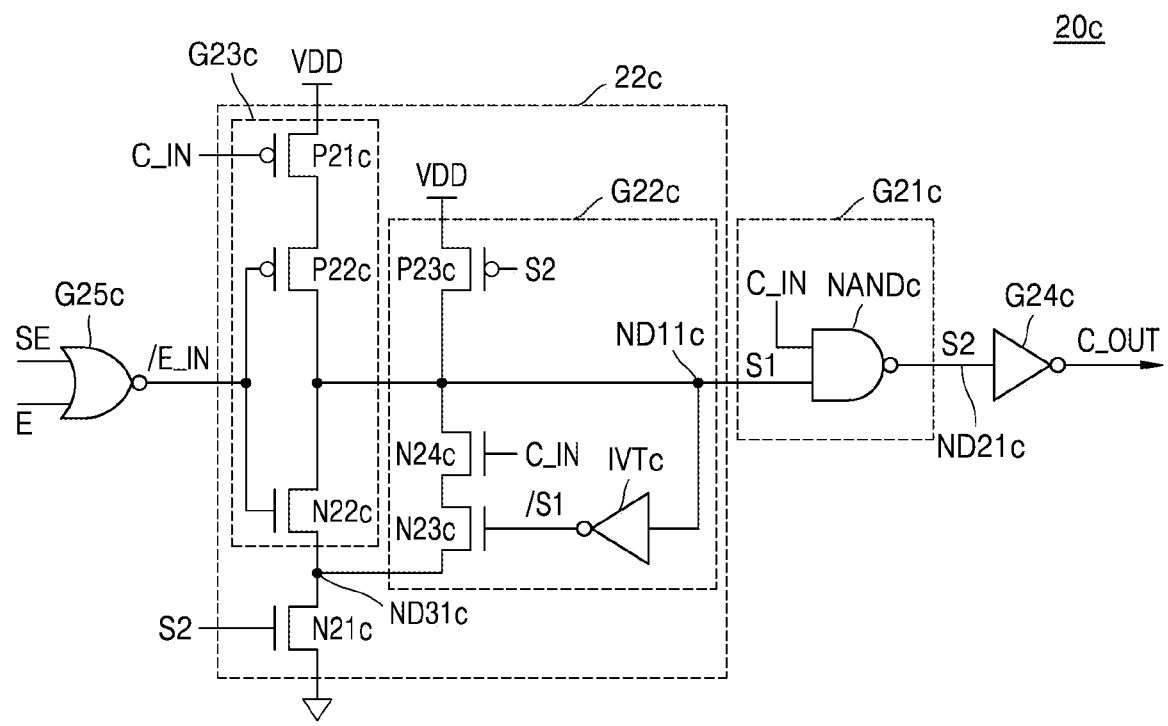

FIGS. 4 and 5 are circuit diagrams of examples of a clock gating cell 20b and a clock gating cell 20c according to example embodiments of the inventive concepts. Hereinafter, among descriptions of FIGS. 4 and 5, descriptions that are the same as those of FIG. 2 are omitted.

Referring to FIG. 4, the clock gating cell 20b may include a first NAND gate G21b, an OAI gate 22b, a first inverter G24b, and/or a NOR gate G25b. The OAI gate 22b may include a 4-input keeping logic gate G22b and/or a second 2-input logic gate G23b.

The OAI gate 22b may include a first NFET N21b through a fourth NFET N24b and/or a first PFET P21b through a third PFET P23b, which receive the inverted enable input /E_IN, the clock input C_IN, the second signal S2, and/or the inverted first signal /S1, and/or may include a second inverter IVTb which receives the first signal S1 and generates the inverted first signal /S1. The first NAND gate G21b may include a fifth NFET N25b, a fourth PFET P24b, and/or a fifth PFET P25b, which receive the inverted first signal /S1, the clock input C_IN, and/or the first signal S1. Here, the first NAND gate G21b may also be referred to as a 3-input logic gate.

To describe a connection structure of the four-input keeping logic gate G22b in detail, the third PFET P23b may be connected to a second node ND21b through a gate thereof and receive the second signal S2, and/or may be connected to the power voltage VDD through a source thereof. The third NFET N23b may receive the inverted first signal /S1 through a gate thereof, and/or may be connected to a source of the fourth NFET N24b through a drain thereof. The fourth NFET N24b may receive the clock input C_IN through a gate thereof, and/or may be connected to a drain of the third PFET P23b at a first node ND11b through a drain thereof. An input of the second inverter IVTb may be connected to the first node ND11b and receive the first signal S1, and/or may output the inverted first signal /S1 to the first NAND gate G21b.

To describe a connection structure of the first NAND gate G21b in detail, the fifth NFET N25b may receive the clock input C_IN through a gate thereof, may receive the inverted first signal /S1 through a drain thereof, and/or may be connected to a second node ND21b through a source thereof. The fourth PFET P24b may be connected to the power voltage VDD through a source thereof, may be connected to the first node ND11b through a gate thereof and receive the first signal S1, and/or may be connected to the second node ND21b through a drain thereof. The fifth PFET P25b may be connected to the power voltage VDD through a source thereof, may receive the clock input C_IN through a gate thereof, and/or may be connected to the second node ND21b through a drain thereof. The fourth PFET P24b and the fifth PFET P25b may be connected in parallel to each other.

Referring to FIG. 5, the clock gating cell 20c may include a first NAND gate G21c, an OAI gate 22c, a first inverter G24c, and/or a NOR gate G25c. The OAI gate 22c may include a 4-input keeping logic gate G22c and/or a second 2-input logic gate G23c.

The OAI gate 22c may include a first NFET N21c through a fourth NFET N24c and/or a first PFET P21c through a third PFET P23c which receive the inverted enable input /E_IN, the second signal S2, and/or the inverted first signal /S1, and may include a second inverter IVTc which receives the first signal S1 and generates the inverted first signal /S1. The first NAND gate G21c may include a NAND gate NANDc.

To describe a connection structure of the 4-input keeping logic gate G22c in detail, a third PFET P23c may receive the second signal S2 through a gate thereof, and/or may be connected to the power voltage VDD through a source thereof. The third NFET N23c may receive the inverted first signal /S1 through a gate thereof, and/or may be connected to a source of the fourth NFET N24c through a drain thereof. The fourth NFET N24c may receive the clock input C_IN through a gate thereof, and/or may be connected to a drain of the third PFET P23c at a first node ND11c of through a drain thereof. An input of the second inverter IVTc may be connected to the first node ND11c and receive the first signal S1, and/or may provide the inverted first signal /S1 to the gate of the third NFET N23c.

To describe a connection structure of the first NAND gate G21c in detail, the NAND gate NANDc may receive the clock input C_IN and/or the first signal S1 and generate the second signal S2. The NAND gate NANDc may be connected to the first inverter G24c through the second node ND21c.

The clock gating cells 20a, 20b, and 20c shown in FIGS. 2, 4, and 5 are merely example embodiments and are not limited thereto, and the clock gating cell may be implemented by variously arranging transistors and logic gates to include a structure to which the inventive concepts are reflected.

Figure 6A:
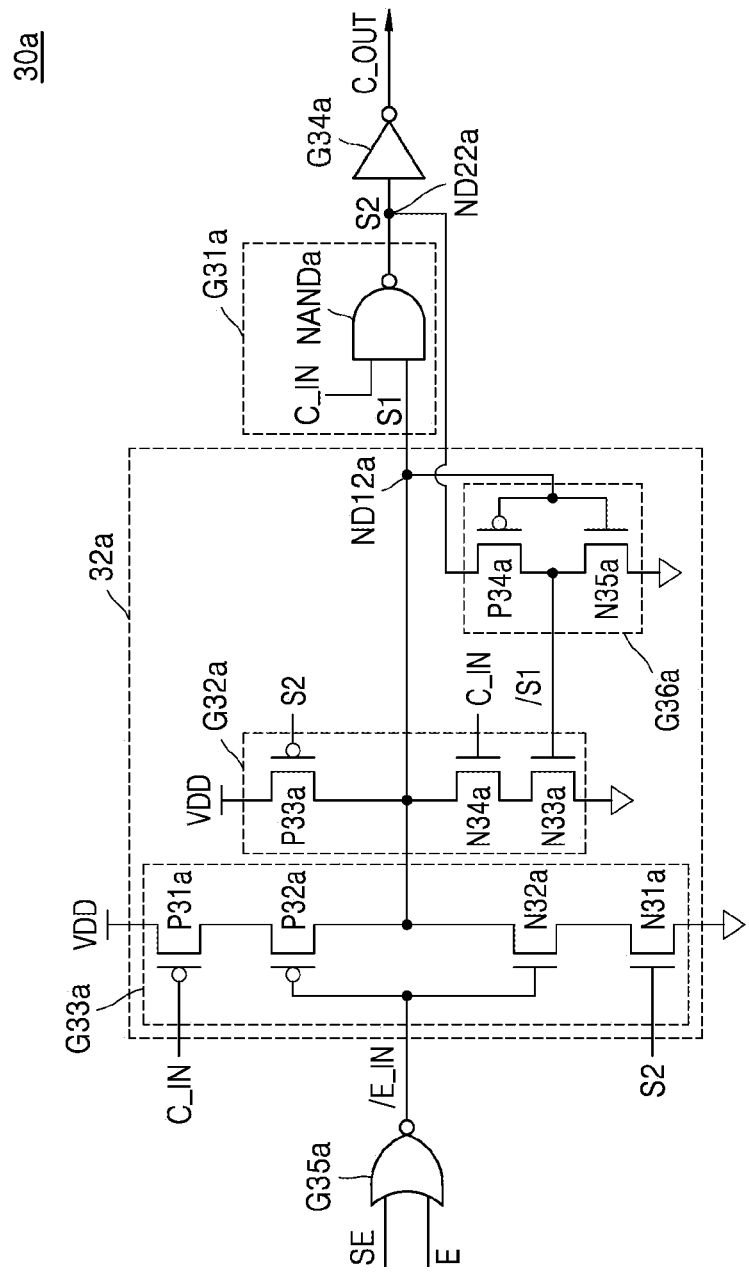
FIGS. 6A and 6B are circuit diagrams of examples of the clock gating cell shown in FIG. 1B.
Figure 6B:
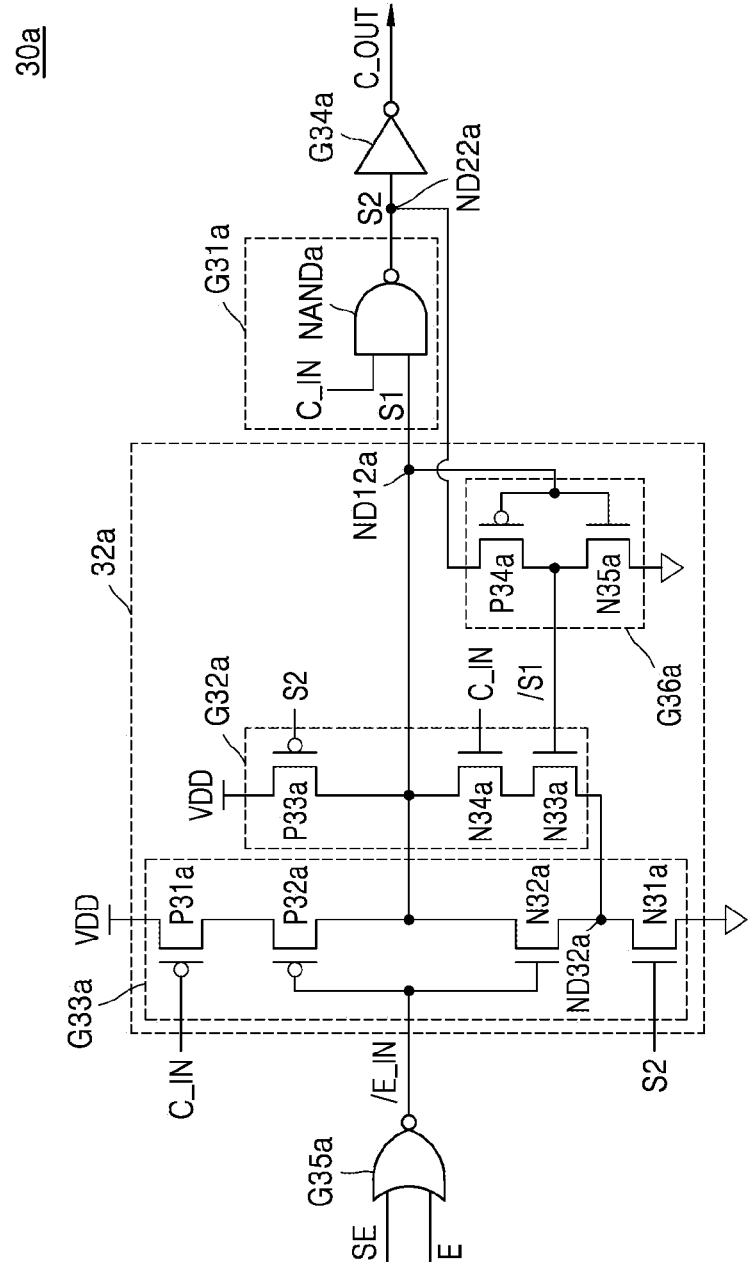

FIGS. 6A and 6B are circuit diagrams of examples of the clock gating cell 10b shown in FIG. 1B. Hereinafter, among descriptions of FIGS. 6A and 6B, descriptions that are the same as those of FIG. 1B are omitted.

Referring to FIG. 6A, a clock gating cell 30a may include a first NAND gate G31a, an OAI gate 32a, an inverter G34a, and/or a NOR gate G35a. The first NAND gate G31a may correspond to the first 2-input logic gate G11b shown in FIG. 1B, and/or the OAI gate 32a may correspond to the 3-input logic gate 12b shown in FIG. 1B. The OAI gate 32a may include a 3-input keeping logic gate G32a, a first 2-input logic gate G33a, and/or a third 2-input logic gate G36a.

The first 2-input logic gate G33a may include a first NFET N31a, a second NFET N32a, a first PFET P31a, and/or a second PFET P32a, which receive the clock input C_IN, the inverted enable input /E_IN, and/or the second signal S2. The 3-input keeping logic gate G32a may include a third NFET N33a, a fourth NFET N34a, and/or a third PFET P33a, which respectively receive the inverted first signal /S1, the clock input C_IN, and/or the second signal S2. The third 2-input logic gate G36a may include a fifth NFET N35a and/or a fourth PFET P34a, which receive the first signal S1. In addition, the fourth PFET P34a may receive the second signal S2 through a source thereof. The first NAND gate G31a may include a NAND gate NANDa, which receives the first signal S1 and/or the clock input C_IN and generates the second signal S2. The NAND gate NANDa may be connected to the inverter G34a through a second node ND22a.

To describe a connection structure of the second 2-input logic gate G33a in detail, the first PFET P31a may receive the clock input C_IN through a gate thereof, and/or may be connected to the power voltage VDD through a source thereof. The second PFET P32a may be connected to a drain of the first PFET P31a through a source thereof, and/or may receive the inverted enable input /E_IN through a gate thereof. The second NFET N32a may receive the inverted enable input /E_IN through a gate thereof, and/or may be connected to a drain of the second PFET P32a at a first node ND12a through a drain thereof. The first NFET N31a may be connected to the second node ND22a through a gate thereof and receive the second signal S2, may be connected to a source of the second NFET N32a through a drain thereof, and/or may be connected to the ground node through a source thereof. The first NFET N31a may form (or generate) or block a discharge path of the second 2-input logic gate G33a in response to the second signal S2.

To describe a connection structure of the 3-input keeping logic gate G32a in detail, the third PFET P33a may be connected to the second node ND22a through a gate thereof and/or receive the second signal S2, and/or may be connected to the power voltage VDD through a source thereof. The third NFET N33a may receive the inverted first signal /S1 through a gate thereof, and/or may be connected to a source of the fourth NFET N34a through a drain thereof. The fourth NFET N34a may receive the clock input C_IN through a gate thereof, and/or may be connected to a drain of the third PFET P33a at the first node ND12a through a drain thereof. The third NFET N33a may form (or generate) or block a discharge path of the 3-input keeping logic gate G32a in response to the inverted first signal /S1.

To describe a connection structure of the third 2-input logic gate G36a in detail, the fourth PFET P34a may receive the first signal S1 through a gate thereof, and/or may be connected to the second node ND22a through a source thereof and receive the second signal S2. The fifth NFET N35a may receive the first signal S1 through a gate thereof, may be connected to a drain of the fourth PFET P34a through a drain thereof, and/or may be connected to the ground node through a source thereof. The third 2-input logic gate G36a may receive the first signal S1 and invert the first signal S1, and may provide the inverted first signal /S1 to the third NFET N33a. The third 2-input logic gate G36a may perform an inverting operation on the first signal S1 by using the second signal S2, and accordingly, as the inverting operation may be performed when the second signal S2 is a high level, power may be efficiently consumed by reducing inverting operations. The third 2-input logic gate G36a may be referred to as an inverter.

Referring to FIG. 6B, compared to FIG. 6A, the second 2-input logic gate G33a and the 3-input keeping logic gate G32a may share a mutual discharge path for the first signal. In detail, a source of the third NFET N33a may be connected to the drain of the first NFET N31a through the third node ND32a and the first NFET N31a may form (or generate) or block a shared discharge path in response to the second signal S2.

Figure 7:
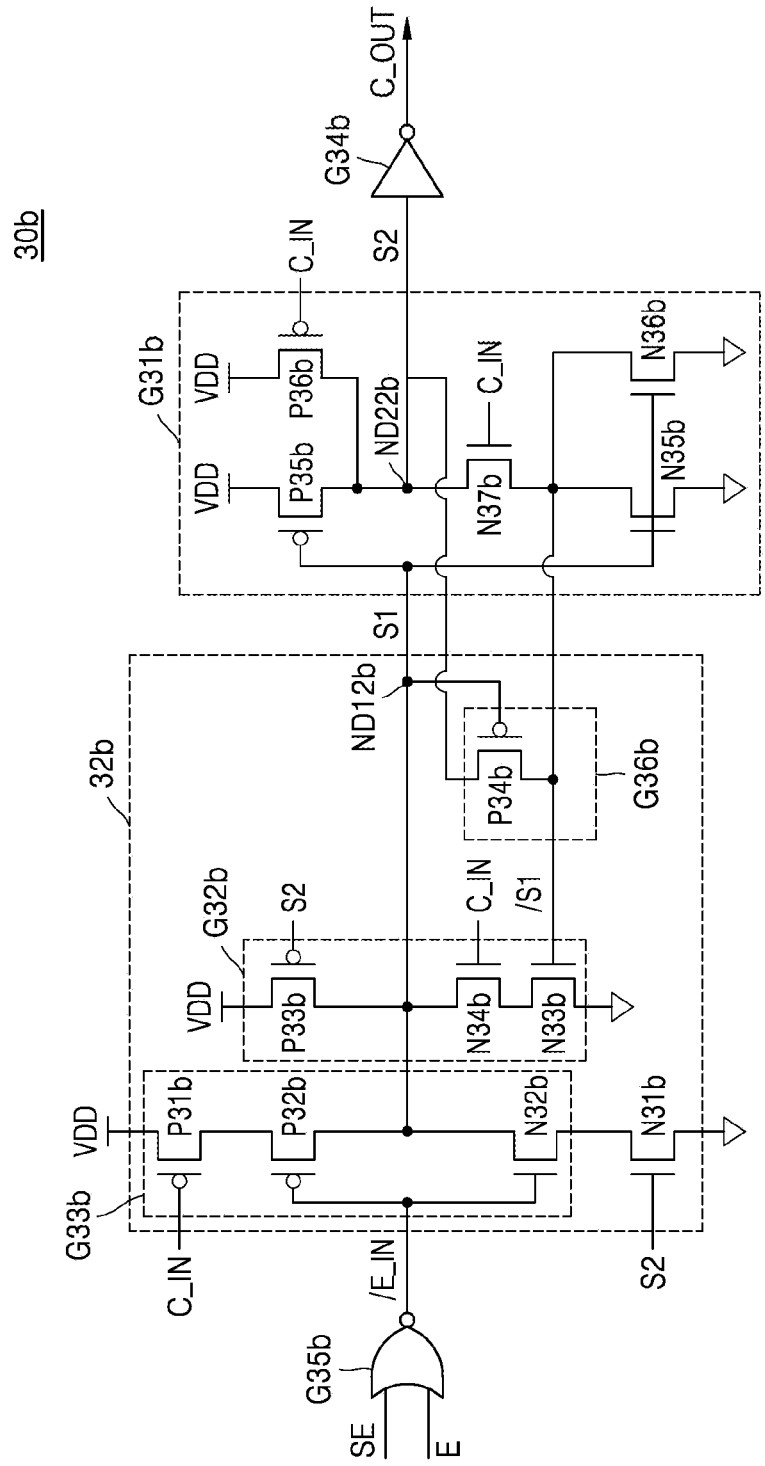
FIGS. 7 through 9 are circuit diagrams of examples of a clock gating cell according to an example embodiment of the inventive concepts.
Figure 8:
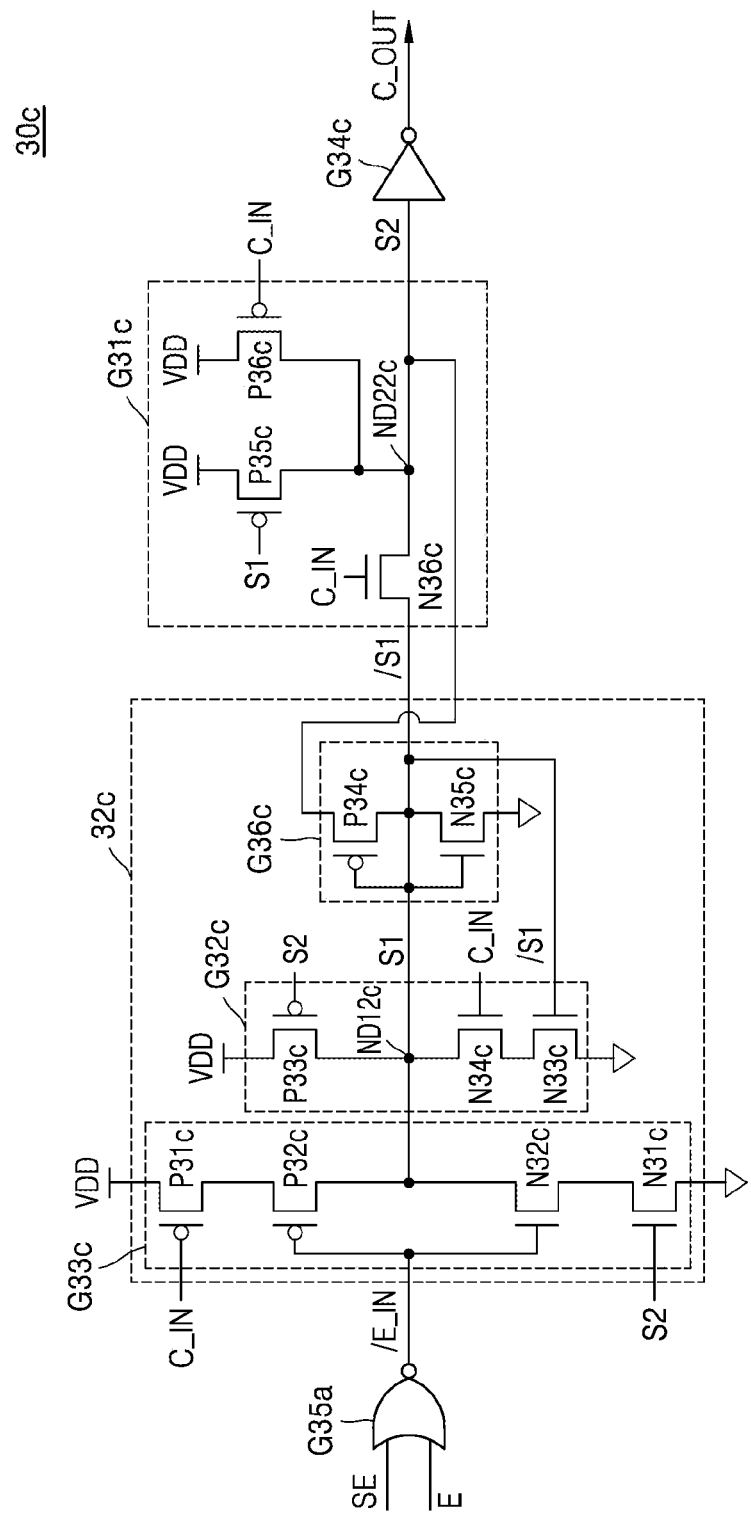
Figure 9:
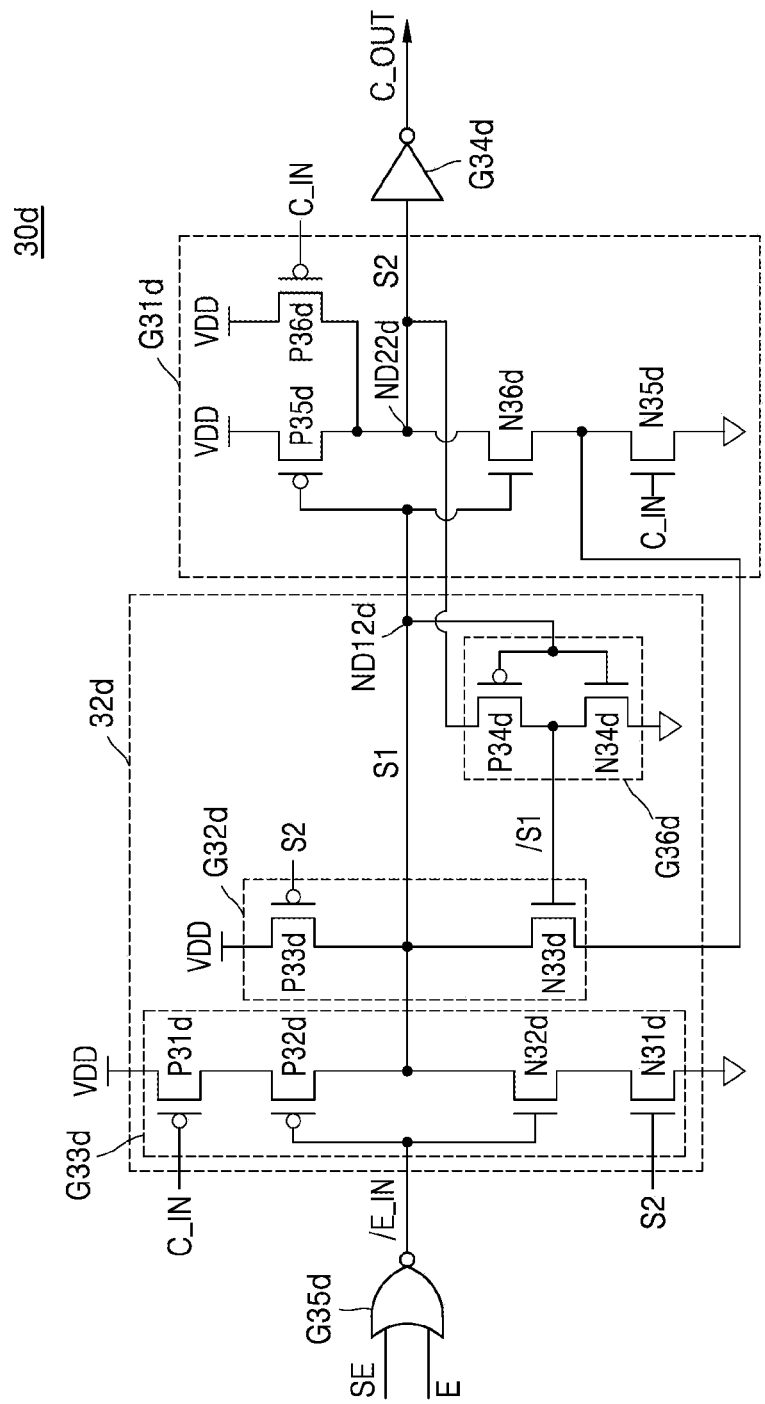

FIGS. 7 through 9 are circuit diagrams of examples of a clock gating cell 30b, a clock gating cell 30c, and a clock gating cell 30d according to example embodiments of the inventive concepts. Hereinafter, among descriptions of FIGS. 7 through 9, descriptions that are the same as those of FIGS. 6A and 6B are omitted.

Referring to FIG. 7, a clock gating cell 30b may include a first NAND gate G31b, an OAI gate 32b, an inverter G34b, and/or a NOR gate G35b. The OAI gate 32b may include a 3-input keeping logic gate G32b, a second 2-input logic gate G33b, and/or a third 2-input logic gate G36b.

The third 2-input logic gate G36b may include a fourth PFET P34b. The fourth PFET P34b may be connected to a first node ND12b through a gate thereof and receive the first signal S1, and/or may be connected to a second node ND22b through a source thereof and receive the second signal S2.

The first NAND gate G31b may include a fifth PFET P35b, a sixth PFET P36b, and/or a fifth NFET N35b through a seventh NFET N37b, which receive the first signal S1 and/or the clock input C_IN. The fifth PFET P35b may receive the first signal S1 through a gate thereof, and/or may be connected to the power voltage VDD through a source thereof. The sixth PFET P36b may receive the clock input C_IN through a gate thereof, may be connected to the power voltage VDD through a source thereof, and/or may be connected to a drain of the fifth PFET P35b at the second node ND22b through a drain thereof. The fifth PFET P35b and the sixth PFET P36b may be connected in parallel to each other and construct a pull-up logic of the first NAND gate G31b. The fifth NFET N35b may receive the first signal S1 through a gate thereof, and/or may be connected to the ground node through a source thereof. The sixth NFET N36b may receive the first signal S1 through a gate thereof, and/or may be connected to the ground node through a source thereof. The fifth NFET N35b and the sixth NFET N36b may be connected in parallel to each other, and may construct a pull-down logic of the first NAND gate G31b. The number of transistors (e.g. the fifth PFET P35b and the sixth PFET P36b) constructing the pull-up logic of the first NAND gate G31b is identical (or equal to) to the number of transistors (that is, the fifth NFET N35b and the sixth NFET N26a) constructing the pull-down logic, and thus, a pull-up strength and a pull-down strength may be equal to each other. The seventh NFET N37b may receive the clock input C_IN through a gate thereof, may be connected to the second node ND22b through a drain thereof, and/or may be connected to drains of the fifth NFET N35b and/or the sixth NFET N36b through a source thereof.

Referring to FIG. 8, compared to FIG. 7, a third 2-input logic gate G36c may include a fourth PFET P34c and/or a fifth NFET N35c, and/or a first NAND gate G31c may include a sixth NFET N36c, a fifth PFET P35c, and/or a sixth PFET P36c.

To describe a connection structure of the third 2-input logic gate G36a in detail, the fourth PFET P34c may be connected to a first node ND12c through a gate thereof and receive the first signal S1, and/or may be connected to a second node ND22c through a source thereof and receive the second signal S2. The fifth NFET N35c may be connected to the first node ND12c through a gate thereof and receive the first signal S1, may be connected to the ground node through a source thereof, and/or may be connected to a drain of the fourth PFET P34c through a drain thereof. The third 2-input logic gate G36c may invert the first signal S1 by using the second signal S2, and may provide the inverted first signal S1 to the first NAND gate G31 and the second 2-input logic gate G33c. The third 2-input logic gate G36 may also be referred to as an inverter.

To describe a connection structure of the first NAND gate G31c in detail, the sixth NFET N36c may receive the clock input C_IN through a gate thereof, may receive the inverted first signal /S1 through a drain thereof, and/or may be connected to the second node ND22c through a source thereof. The fifth PFET P36c may be connected to the power voltage VDD through a source thereof, may receive the first signal S1 through a gate thereof, and/or may be connected to the second node ND22c through a drain thereof. The sixth PFET P36c may be connected to the power voltage VDD through a source thereof, may receive the clock input C_IN through a gate thereof, and/or may be connected to the second node ND22c through a drain thereof. The fifth PFET P35c and the sixth PFET P36c may be connected in parallel to each other.

Referring to FIG. 9, a clock gating cell 30d may include a first NAND gate G31d, an OAI gate 32d, an inverter G34d, and/or a NOR gate G35d. The OAI gate 32d may include a 2-input keeping logic gate G32d, a second 2-input logic gate G33d, and/or a third 2-input logic gate G36d.

Compared to FIG. 7, the 2-input keeping logic gate G32d may include a third PFET P33d and/or a third NFET N33d, the third 2-input logic gate G36d may include a fourth PFET P34d and/or a fourth NFET N34d, and/or the first NAND gate G31d may include a fifth NFET N35d, a sixth NFET N36d, a fifth PFET P35d, and/or a sixth PFET P36d.

To describe a connection structure of the 2-input keeping logic gate G32d in detail, the third PFET P33d may be connected to the second node ND22d through a gate thereof and receive the second signal S2, and/or may be connected to the power voltage VDD through a source thereof. The third NFET N33d may receive the inverted first signal /S1 through a gate thereof, may be connected to a drain of the third PFET P33d through a drain thereof, and/or may be connected to a drain of the fifth NFET N35d through a source thereof.

To describe a connection structure of the third 2-input logic gate G36d in detail, the fourth PFET P34d may be connected to a first node ND12d through a gate thereof and receive the first signal S1, and/or may be connected to the second node ND22d through a source thereof and receive the second signal S2. The fifth NFET N34d may be connected to the first node ND12d through a gate thereof and receive the first signal S1, may be connected to the ground node through a source thereof, and/or may be connected to a drain of the fourth PFET P34d through a drain thereof. The third 2-input logic gate G36d may invert the first signal S1 by using the second signal S2 and provide the inverted first signal /S1 to the 2-input keeping logic gate G32d. The third 2-input logic gate G36d may also be referred to as an inverter.

To describe a connection structure of the first NAND gate G31d in detail, the fifth PFET P35d may be connected to the first node ND12d through a gate thereof and receive the first signal S1, may be connected to the power voltage VDD through a source thereof, and/or may be connected to the second node ND22d through a drain thereof. The sixth PFET P36d may receive the clock input C_IN through a gate thereof, may be connected to the power voltage VDD through a source thereof, and/or may be connected to the second node ND22d through a drain thereof. The fifth PFET P35d and the sixth PFET P36d may be connected in parallel to each other. The fifth NFET P35d may receive the clock input C_IN through a gate thereof, may be connected to the ground node through a source thereof, and/or may be connected to a source of the third NFET N33d through a drain thereof. The sixth NFET N36d may be connected to the first node ND12 through a gate thereof and receive the first signal S1, may be connected to the drain of the fifth NFET N35d through a source thereof, and/or may be connected to the second node ND22d through a drain thereof. The 2-input keeping logic gate G32d and the first NAND gate G31d may share a discharge path for the first signal S1 and the second signal S2. The fifth NFET N35d may form (or generate) or block the shared discharge path, in response to the clock input C_IN.

The clock gating cells 30a, 30b, 30c, and 30d shown in FIGS. 6A through 9 are merely example embodiments and are not limited thereto, and the clock gating cell may be implemented by variously arranging transistors and logic gates to include a structure to which the inventive concepts are reflected.

Figure 10:
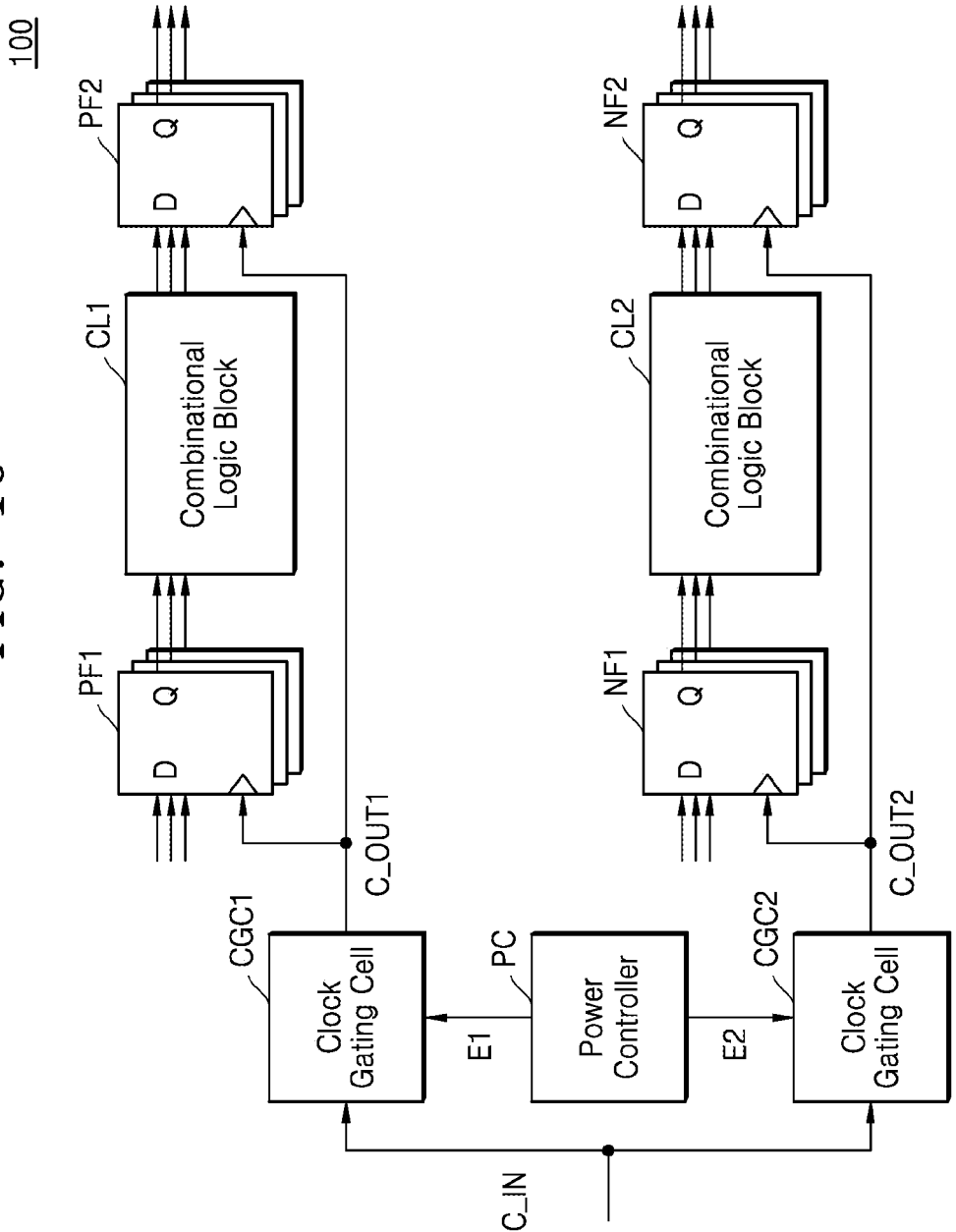
FIG. 10 is a block diagram of an example of an integrated circuit including a clock gating cell according to an example embodiment of the inventive concepts.

FIG. 10 is a block diagram of an example of an integrated circuit 100 including a clock gating cell according to an example embodiment of the inventive concepts. In some example embodiments, the clock gating cell described above with reference to the drawings may be included in an integrated circuit configured to process a digital signal.

As shown in FIG. 10, the integrated circuit 100 may include a first clock gating cell CGC1, a second clock gating cell CGC2, a power controller PC, a first combination logic block CL1, a second combination logic block CL2, and/or a plurality of flip-flops (e.g., a first positive edge triggered flip-flop PF1, a second positive edge triggered flip-flop PF2, a first negative edge triggered flip-flop NF1, and/or a second negative edge triggered flip-flop NF2).

The power controller PC may control power of the integrated circuit 100, and/or may generate a first clock enable E1 and/or a second clock enable E2. For example, the power controller PC may generate the first clock enable E1 that is deactivated to reduce power consumption by a digital circuit including at least one first positive edge triggered flip-flop PF1, the first combination logic block CL1, and/or at least one second positive edge triggered flip-flop PF2. In addition, the power controller PC may generate the second clock enable E2 that is deactivated to reduce power consumption by a digital circuit including at least one first negative edge triggered flip-flop NF1, the second combination logic block CL2, and/or at least one second negative edge triggered flip-flop NF2.

The first combination logic block CL1 and the second combination logic block CL2 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The first clock gating cell CGC1 may receive the clock input C_IN, and may stop or resume supply of a clock output C_OUT1 based on the first clock enable E1. In addition, the second clock gating cell CGC2 may receive the clock input C_IN, and may stop or resume providing a second clock output C_OUT2 based on the second clock enable E2.

Figure 11:
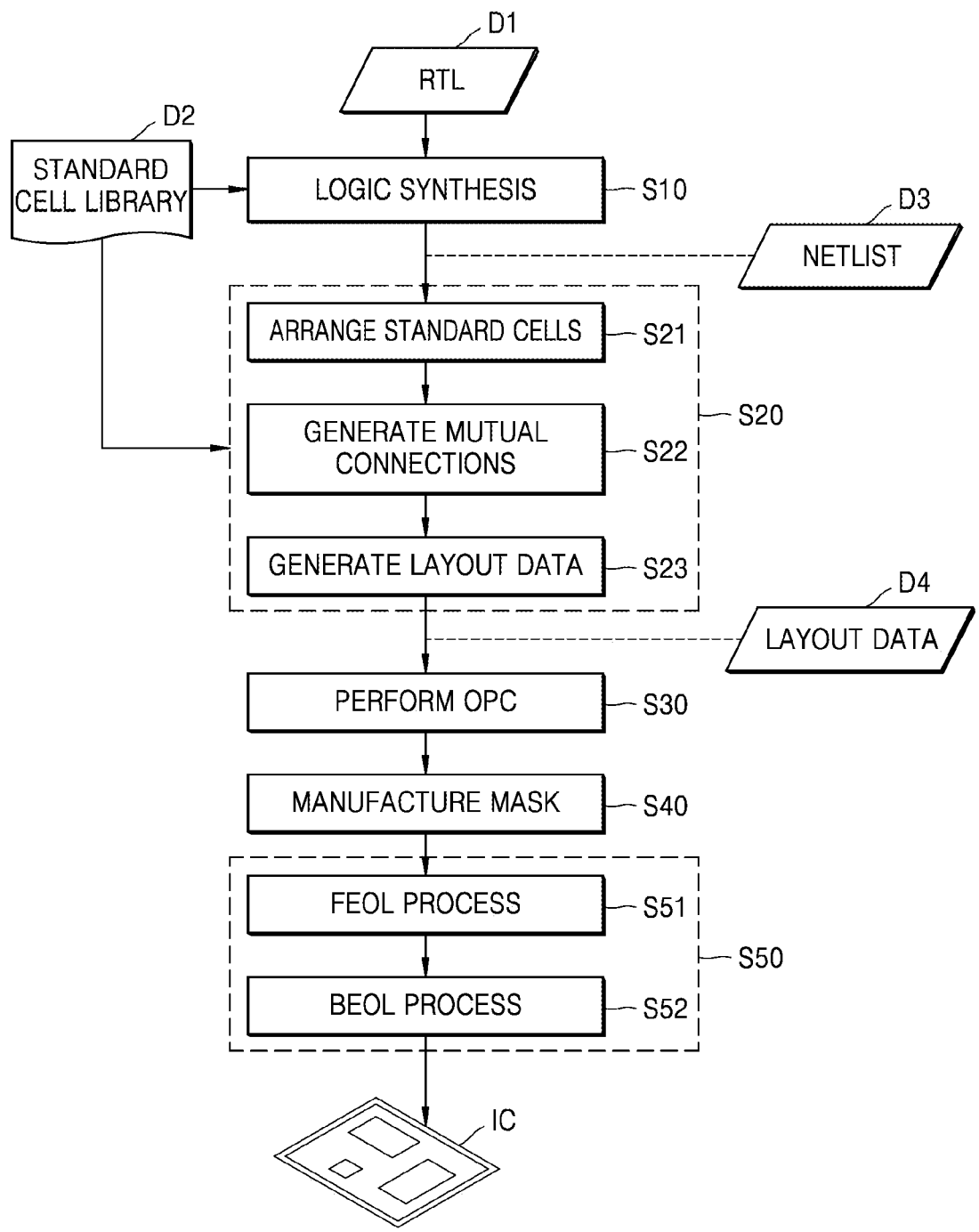
FIG. 11 is a flowchart of a method of manufacturing an integrated circuit, according to an example embodiment of the inventive concepts.

FIG. 11 is a flowchart of a method of manufacturing an integrated circuit, according to an example embodiment of the inventive concepts. In detail, the flowchart shown in FIG. 11 shows a method of manufacturing an integrated circuit IC (e.g., the integrated circuit 100 in FIG. 10) including the clock gating cell described above.

In some example embodiments, the clock gating cell may be defined as a standard cell. The standard cell, which is a unit of a layout included in the integrated circuit IC, may be simply referred to as a cell. The integrated circuit IC may include a plurality of various standard cells, and each (or one or more) of the standard cells may provide an intrinsic function. The standard cells may have a structure obeying predetermined (or alternately given) rules based on a semiconductor process for manufacturing the integrated circuit IC, for example, may have a constant length or multiples thereof in a certain direction on a plane that is perpendicular to a direction in which layers are stacked.

A standard cell library (or a cell library) D2 may include information regarding the standard cells, for example, function information, characteristic information, layout information, and the like, and may also include information regarding the clock gating cell. As described above with reference to the drawings, the clock gating cell defined by the standard cell library D2 may provide high efficiency such as a reduced area and low power consumption, as well as high operation reliability.

In operation S10, a logic synthesis operation may be performed to generate a netlist D3 from RTL data D1. For example, a semiconductor design tool (e.g., a logic synthesis tool) may generate a bitstream or a netlist D3 including the netlist by performing logic synthesis with reference to the standard cell library D2 from the RTL data D1 subscribed with a hardware description language (HDL) such as VHSIC hardware description language (VHDL), Verilog, etc. The standard cell library D2 may include information regarding performance of the clock gating cell, and in a logic synthesis process, the standard cells may be included in the integrated circuit IC with reference to the information.

In operation S20, a place & routing (P&R) operation may be performed to generate layout data D4 from the netlist D3. As shown in FIG. 11, the P&R operation S20 may include a plurality of operations S21, S22, and/or S23. In operation S21, an operation to arrange the standard cells may be performed. For example, a semiconductor design tool (e.g., a P&R tool) may arrange a plurality of standard cells by referring to the standard cell library D2 from the netlist D3. For example, the semiconductor design tool may arrange a layout of a clock gating cell defined by the netlist D3, with reference to the standard cell library D2. In operation S22, an operation to generate interconnections may be performed. The interconnection may electrically connect an output pin to an input pin of the standard cell, and may include, for example, at least one via and/or at least one conductive pattern. In operation S23, the layout data D4 may be generated. The layout data D4 may have, for example a format like GDSII, and may include geometric information regarding the standard cells and interconnections.

Optical Proximity Correction (OPC) may be performed in operation S30. OPC may refer to an operation for forming a desired pattern shape by calibrating distortion such as refraction caused due to characteristics of light in photolithography included in a semiconductor process for manufacturing the integrated circuit IC, and a pattern on a mask may be determined by applying OPC to the layout data D4. In some example embodiments, a layout of the integrated circuit IC may be limitedly changed in operation S30, and in operation S30, the limited change in the integrated circuit IC is a post-processing to improve or optimize a structure of the integrated circuit IC, and may be referred to as design polishing.

In operation S40, manufacturing of a mask may be performed. For example, as OPC is applied to the layout data D4, patterns on the mask may be defined to form patterns on a plurality of layers, and at least one mask (or a photomask) may be manufactured for forming patterns on the plurality of layers.

In operation S50, fabrication of the integrated circuit IC may be performed. For example, the integrated circuit IC may be fabricated by patterning a plurality of layers by using the at least one mask manufactured in operation S40. As shown in FIG. 11, operation S50 may include operations S51 and/or S52. In operation S51, a front-end-of-line (FEOL) process may be performed. In processes of manufacturing the integrated circuit IC, the FEOL may refer to a process of forming individual devices, for example, a transistor, a capacitor, a resistor, and the like on a substrate. For example, the FEOL may include planarizing and cleaning a wafer, forming a trench, forming a well, forming a gate line, forming a source and/or a drain. In operation S52, a back-end-of-line (BEOL) process may be performed. In processes of manufacturing the integrated circuit IC, the BEOL may refer to a process of mutually connecting individual devices, for example, a transistor, a capacitor, a resistor, and the like. For example, the BEOL may include silicidation on a gate region, a source region, and/or a drain region, adding a dielectric, planarizing, forming a hole, adding a metal layer, forming a via, forming a passivation layer, and the like. Next, the integrated circuit IC may be packaged in a semiconductor package and may be used as a component of various applications. As described above, the integrated circuit IC may have high performance and efficiency due to extraordinary characteristics of the clock gating cell, and consequentially, the performance and efficiency of an application including the integrated circuit IC may be improved.

While the inventive concepts have been particularly shown and described with reference to example embodiments thereof, it will be understood that various changes in form and details may be made therein without departing from the spirit and scope of the following claims.

What is claimed is:

1. An integrated circuit comprising a clock gating cell based on a set-reset (SR) latch,
   the clock gating cell comprising:
   a first 2-input logic gate configured to
      receive a clock input and a first signal, and
      generate a second signal;
   a first inverter configured to
      receive the second signal, and
      generate a clock output; and
   a 4-input logic gate comprising:
      a 4-input keeping logic gate configured to
         generate the SR latch by being cross-coupled to the first 2-input logic gate, and
         keep a level of the first signal;
      a second 2-input logic gate configured to
         receive the clock input and an inverted enable input, and
         generate the first signal, and
      a first transistor connected to a ground node, the first transistor configured to
         receive the second signal, and
         generate a discharge path shared by the 4-input keeping logic gate and the second 2-input logic gate.

2. The integrated circuit of claim 1, wherein the first transistor comprises an n-channel Field Effect Transistor (NFET) configured to generate or block the discharge path in response to the second signal.

3. The integrated circuit of claim 1, wherein the first 2-input logic gate comprises:
   a pull-up logic configured to receive the first signal and the clock input; and
   a pull-down logic configured to receive the first signal, wherein a number of transistors included in the pull-up logic is equal to a number of transistors included in the pull-down logic.

4. The integrated circuit of claim 1, wherein the 4-input keeping logic gate is configured to:
receive the first signal, the second signal, the clock input, and an inverted first signal; and
generate a charge path or the discharge path for the first signal.

5. The integrated circuit of claim 1, wherein the 4-input keeping logic gate comprises:
a second transistor configured to maintain a high level of an inverted first signal by using the second signal, in response to the first signal.

6. The integrated circuit of claim 1, wherein the 4-input keeping logic gate further comprises:
a second transistor connected to the first transistor and configured to generate the discharge path in response to the inverted first signal; and
a second inverter configured to
invert the first signal using the second signal, and
provide the inverted first signal to the second transistor.

7. The integrated circuit of claim 6, wherein the second inverter is connected to a node between the first inverter and the first 2-input logic gate, and
the second inverter is configured to receive the second signal as power.

8. A clock gating cell based on a set-reset (SR) latch, the clock gating cell comprising:
a first NAND gate configured to
receive a first signal and a clock input, and
generate a second signal;
a first inverter configured to
receive the second signal, and
generate a clock output; and
an OR-AND-INVERTER (OAI) gate configured to provide a second NAND gate, the second NAND gate configured to
generate the first signal, and
generate the SR latch by being cross-coupled to the first NAND gate,
wherein the OAI gate comprises:
an input logic gate configured to generate the first signal based on an inverted enable input and the clock input;
an input keeping logic gate configured to keep a level of the first signal based on the first signal, the second signal, the clock input, and an inverted first signal; and
a first n-channel Field Effect Transistor (NFET) connected between a first node and a ground node, the first NFET configured to generate a discharge path, and the first node being shared by the input keeping logic gate and the input logic gate.

9. The clock gating cell of claim 8, wherein the first NFET is configured to generate or block the discharge path in response to the second signal.

10. The clock gating cell of claim 8, wherein
the input logic gate comprises a second NFET,
the input keeping logic gate comprises a third NFET, and
a source of the second NFET and a source of the third NFET are each connected to the first node.

11. The clock gating cell of claim 8, wherein a drain of the first NFET is connected to the first node and a source of the first NFET is connected to the ground node.

12. The clock gating cell of claim 8, wherein the first NAND gate comprises:
a pull-up logic comprising:
a first p-channel Field Effect Transistor (PFET) configured to receive the first signal through a gate of the first PFET; and
a second PFET configured to receive the clock input through a gate of the second PFET,
wherein the first PFET and the second PFET are connected in parallel to each other; and
a pull-down logic comprising:
a second NFET configured to receive the first signal through a gate of the second NFET; and
a third NFET configured to receive the first signal through a gate of the third NFET;
wherein the second NFET and the third NFET are connected in parallel to each other.

13. The clock gating cell of claim 8, wherein
the OAI gate further comprises a second inverter configured to
receive the first signal, and
generate the inverted first signal,
the first NAND gate comprises:
a second NFET configured to
receive the inverted first signal through a drain of the second NFET, and
receive the clock input through a gate of the second NFET; and
a first PFET connected to a power voltage through a source of the first PFET and connected to a source of the second NFET through a drain of the first PFET,
wherein the first PFET is configured to receive the first signal through a gate of the first PFET; and
a second PFET connected to the power voltage through a source of the second PFET and connected to the source of the second NFET through a drain of the second PFET,
wherein the second PFET is configured to receive the clock input through a gate of the second PFET, and
wherein the first PFET and the second PFET are connected to be parallel to each other, and the first PFET and the second PFET are configured to generate the second signal.

14. The clock gating cell of claim 8, wherein the input keeping logic gate comprises:
a first PFET connected to a power voltage through a source of the first PFET, and connected to a second node through a drain of the first PFET, the second node configured to output the first signal, and the first PFET configured to receive the second signal through a gate of the first PFET;
a second NFET connected to the second node through a drain of the second NFET, the second NFET configured to receive the clock input through a gate of the second NFET;
a third NFET connected to a source of the second NFET through a drain of the third NFET and connected to the first node through a source of the third NFET, the third NFET configured to receive the inverted first signal through a gate of the third NFET; and
a second PFET connected to the power voltage through a source of the second PFET, connected to the second node through a gate of the second PFET, and connected to the gate of the third NFET through a drain of the second PFET.

15. A clock gating cell based on a set-reset (SR) latch, the clock gating cell comprising:

a first NAND gate configured to
receive a first signal and a clock input, and
generate a second signal;
a first inverter configured to
receive the second signal, and
generate a clock output; and
an OR-AND-INVERTER (OAI) gate configured to provide a second NAND gate, the second NAND gate configured to
generate the first signal, and
generate the SR latch by being cross-coupled to the first NAND gate,
wherein the OAI gate comprises:
an input logic gate configured to generate the first signal based on an inverted enable input and the clock input; and
an input keeping logic gate configured to keep a level of the first signal based on the first signal, the second signal, the clock input, and an inverted first signal,
wherein the input keeping logic gate comprises:
a second inverter configured to
receive the first signal, and
generate the inverted first signal by using the second signal.

16. The clock gating cell of claim 15, wherein the input keeping logic gate comprises:
a first p-channel Field Effect Transistor (PFET) configured to generate a charge path for maintaining a high level of the first signal, in response to the second signal;
a first n-channel Field Effect Transistor (NFET) configured to generate a discharge path for maintaining a low level of the first signal in response to the clock signal; and
a second NFET configured to generate a discharge path for maintaining a low level of the first signal in response to the inverted first signal.

17. The clock gating cell of claim 16, wherein the OAI gate further comprises a third NFET connected to a ground node and configured to generate the discharge path,
wherein the discharge path is shared by the input keeping logic gate and the input logic gate.

18. The clock gating cell of claim 15, wherein the first NAND gate comprises:
a first NFET configured to
receive the inverted first signal through a drain of the first NFET, and
receive the clock input through a gate of the first NFET;
a first PFET connected to a power voltage through a source of the first PFET, and connected to the source of the first NFET through a drain of the first PFET, wherein the first PFET is configured to
receive the first signal through a gate of the first PFET; and
a second PFET connected to the power voltage through a source of the second PFET, and connected to the source of the first NFET through the a drain of the second PFET, wherein the second PFET is configured to
receive the clock input through a gate of the second PFET.

19. The clock gating cell of claim 15, wherein the first NAND gate comprises:
a first PFET connected to a power voltage through a source of the first PFET and connected to a first node through a drain of the first PFET, the first node configured to output the second signal and the first PFET configured to receive the first signal through a gate of the first PFET;
a second PFET connected to a power voltage through a source of the second PFET, connected to the first node through a drain of the second PFET, and configured to receive the clock input through a gate of the second PFET;
a first NFET connected to the first node through a drain of the first NFET, and configured to receive the first signal through a gate of the first NFET; and
a second NFET connected to the first NFET through a drain of the second NFET, connected to a ground node through a source of the second NFET, and configured to receive the clock input through a gate of the second NFET.

20. The clock gating cell of claim 19, wherein the input keeping logic gate further comprises a third NFET configured to generate a discharge path for the first signal in response to the inverted first signal, and
a source of the third NFET is connected to the drain of the second NFET.

* * * * *